United States Patent [19]
Lauffer et al.

[11] Patent Number: 5,811,736
[45] Date of Patent: Sep. 22, 1998

[54] ELECTRONIC CIRCUIT CARDS WITH SOLDER-FILLED BLIND VIAS

[75] Inventors: John Matthew Lauffer, Waverly; Richard Charles Senger, Vestal, both of N.Y.

[73] Assignee: International Business Machines Corporation, Armonk, N.Y.

[21] Appl. No.: 699,362

[22] Filed: Aug. 19, 1996

[51] Int. Cl.[6] .................................................. H01R 9/09
[52] U.S. Cl. .............................. 174/263; 361/772; 439/83
[58] Field of Search ...................................... 174/250, 261, 174/262, 263, 264; 361/772, 774, 777, 760; 439/68, 83; 257/779, 780, 781; 228/180.1, 180.21, 180.22

[56] References Cited

U.S. PATENT DOCUMENTS

| | | | |
|---|---|---|---|
| 3,610,811 | 10/1971 | O'Keefe . | |
| 5,220,487 | 6/1993 | Patel et al. . | |
| 5,326,937 | 7/1994 | Watanabe | 174/263 |
| 5,373,112 | 12/1994 | Kamimura et al. | 177/255 |
| 5,421,083 | 6/1995 | Suppelsa et al. | 29/852 |
| 5,429,859 | 7/1995 | Young | 428/192 |
| 5,434,365 | 7/1995 | Mori et al. . | |
| 5,451,720 | 9/1995 | Estes et al. . | |
| 5,510,580 | 4/1996 | Shirai et al. | 174/266 |

*Primary Examiner*—Bot L. Ledynh
*Assistant Examiner*—Dhiru R. Patel
*Attorney, Agent, or Firm*—Arthur J. Samodovitz

[57] ABSTRACT

A printed circuit board has a plurality of layers. A first surface land is formed on an inner layer. A dielectric material is laminated on the inner layer. A second surface land is formed on the dielectric material overlapping the inner surface land or positioned along the border of the inner surface land. A hole is etched in the dielectric material exposing the first surface land to the second surface land. The second surface land does not completely surround the hole. A component lead is positioned over the second surface land. Solder is reflowed into the hole to interconnect the surface lands to each other and to the component lead. Because the second surface land does not completely surround the hole, the solder does not bridge across the hole and thereby forms a solid connection between the first and second surface lands.

30 Claims, 4 Drawing Sheets

ELECTRONIC CIRCUIT CARDS WITH SOLDER-FILLED BLIND VIAS

BACKGROUND OF THE INVENTION

The present invention relates generally to electronic circuit cards, and deals more particularly with a technique for interconnecting two surface lands of different layers.

Electronic circuit cards such as printed circuit boards (PCBs) may utilize surface mount technology (SMT) cards or pin-in-hole (PIH). SMT cards used for high power applications typically may comprise a relatively thick carrier layer such as copper (for heat dissipation or ground plane), a plurality of circuit layers and electronic components mounted on a surface of the outermost circuit layer. Each circuit layer comprises a metallization on an insulating sheet, for example, IBM ASM photo-imageable epoxy. The metallization comprises conductors and surface lands. Each component may be soldered to a surface land on the outermost layer, and conductors in the outermost and inner layers may be used to interconnect the component to other components. If conductors in the inner layers are required for the component interconnection, then an inter-layer connection is required between the surface lands of the outermost and inner layers. It was known to etch, punch or drill a hole through the middle of surface lands and the intervening layers and plate the hole to form a blind via to interconnect the outermost and inner surface lands. It is also possible to subsequently fill the blind via with solder to form a more solid connection that is resistant to thermal expansion. While this technique is effective, drilling of blind vias and plating operations are expensive. Through hole vias are not practical for SMT power cards because of the thick carrier layer.

If the PCB does not use a thick carrier, it was known to punch or drill a hole through the middle of the surface lands and all the other layers and plate the hole to form a plated through-hole (PTH) via to interconnect the outermost and inner surface lands. It is also possible to subsequently fill the PTH via with solder. While this technique is effective, drilling of PTH vias and plating operations are expensive.

U.S. Patent application Ser. No. 08/429,612 filed by Lauffer et al. on Apr. 27, 1995 for "Electric Circuit Card and Method of Manufacture" discloses another technique for interconnecting two surface lands. This patent application is hereby incorporated by reference as part of the present disclosure. According to this patent application, a ring-shaped surface land is formed on the outermost layer, a circular surface land is formed on the inner layer and the circuit layers laminated together. Then, the hole within the outermost surface land is etched, but instead of plating the hole to form the interconnection, the hole and outermost surface land are covered with solder paste, a lead of the component is positioned over the outermost surface land, and then the solder is reflowed (i.e. heated) to fill the hole and join to both surface lands and the component lead. While this technique is generally effective and avoids the expensive plating and drilling operations, occasionally the solder bridges across the outermost ring-shaped surface land rising away from the inner land and does not make an optimum connection to the inner surface land. This bridging is caused by surface tension of the solder and the natural tendency of the solder to bond to the metal of the outermost surface land. Gases are also generated during the reflow process and tend to prevent the molten solder from making contact with the inner land, as well as create voids within the solder.

A general object of the present invention is to provide an effective and inexpensive technique to interconnect two surface lands for SMT or PCB applications.

SUMMARY OF THE INVENTION

The invention resides in a PCB for mounting of components. The card comprises a plurality of wiring layers. A first surface land is formed on an inner layer. A dielectric material is laminated on the inner layer. A second surface land is formed on the dielectric material overlapping the inner surface land or positioned along the border of the inner surface land. A hole is etched in the dielectric material exposing the first surface land to the second surface land. The second surface land does not completely surround the hole. Solder is reflowed into the hole to interconnect the surface lands to each other and to a lead of the component. Because the second surface land does not completely surround the hole, the solder does not bridge across the hole and thereby forms a solid connection between the first and second surface lands.

DETAILED DESCRIPTION OF THE PREFERRED EMBODIMENTS

Figure 1:
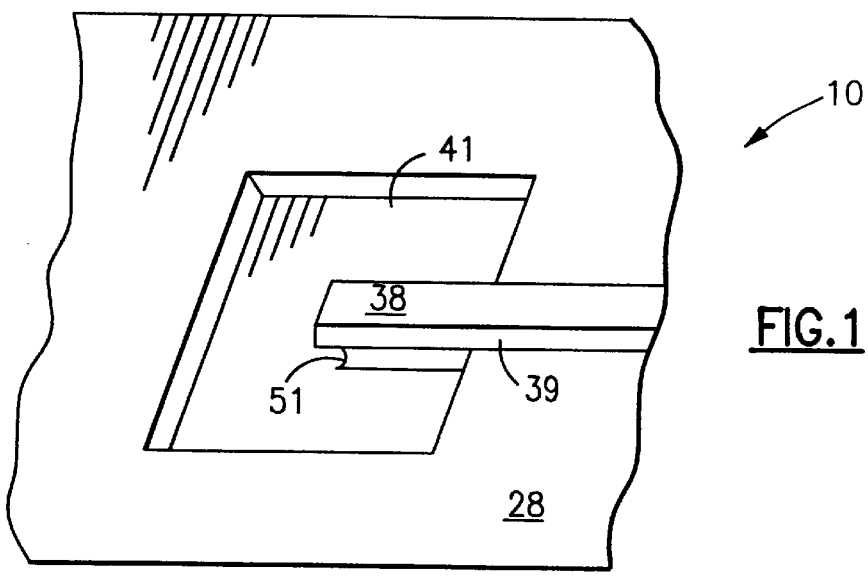
FIG. 1 is a perspective view of a portion of an electronic circuit card according to the present invention during formation; surface lands are provided in two circuit layers but are not yet interconnected.
Figure 2:
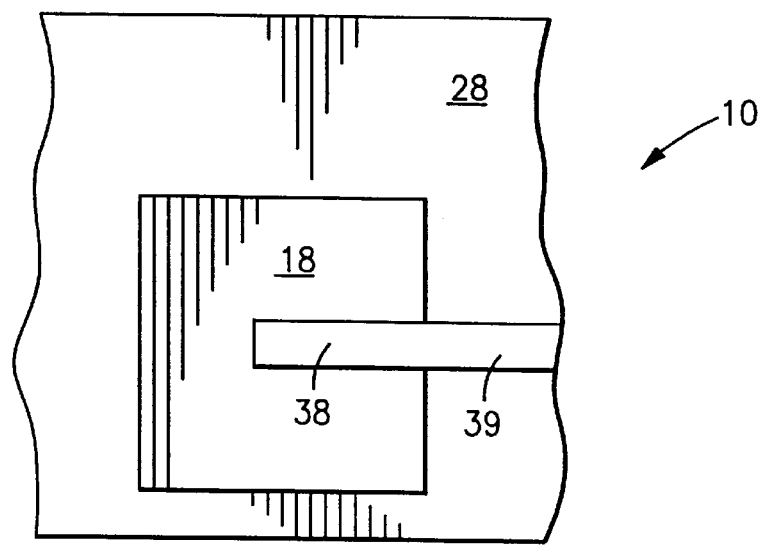
FIG. 2 is a top view of the electronic circuit card of FIG. 1.
Figure 3:
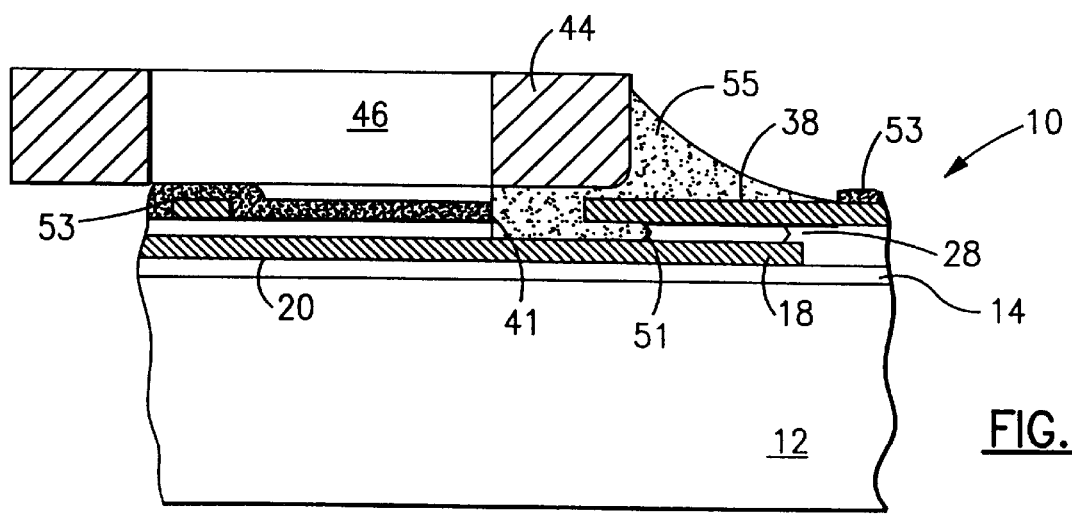
FIG. 3 is a side view of FIG. 2 after a component lead has been soldered to the surface lands.

Referring now to the drawings in detail wherein like reference numbers represent like elements throughout, FIGS. 1–3 illustrate an SMT power electronic circuit card generally designated 10 according to the present invention (although FIG. 1 illustrates the card during formation). In the illustrated embodiment, card 10 is a PCB utilizing SMT. Card 10 includes a carrier 12 which may comprise a copper layer or other layers of the printed circuit board.

Figure 7:
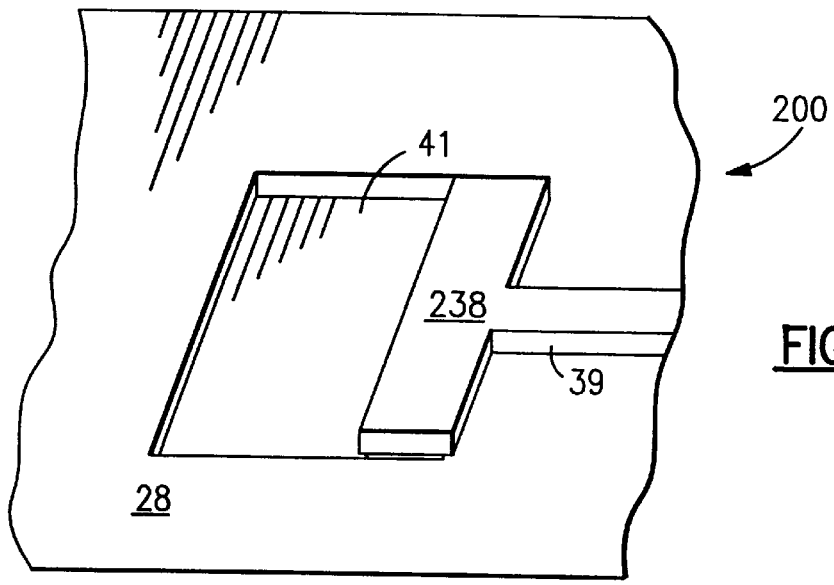
FIG. 7 is a perspective view of a portion of a third electronic circuit card according to a third embodiment of the present invention during formation; surface lands are provided in two circuit layers but are not yet interconnected.

To form the upper layers of card 10, a sheet 14 of dielectric material (for example, 0.002" thick) such as IBM ASM photoimageable epoxy is laminated onto the carrier. Then, a copper foil layer is laminated onto sheet 14. Photolithography is used to define a metallization pattern and is then etched with cupric chloride to remove the unwanted copper. This yields the requisite metallization which includes a surface land 18 (for example, 0.036"×0.056") and conductor 20 which interconnects surface land 18 to another surface land (not shown). In the illustrated embodiment, surface land 18 has a solid rectangular shape, although a solid circular shape would also suffice. Next, another sheet 28 of ASM dielectric material (for example, 0.002" thick) is laminated over the metallization on dielectric sheet 14 and the exposed regions of dielectric sheet 14. Next, another copper foil layer is laminated onto sheet 28, photolithography is used to define metallization and is then etched with cupric chloride to remove the unwanted copper. This yields the requisite metallization including a surface land 38 and a conductor 39 connected to surface land 38 to interconnect the surface land 38 to another component (not shown) on the outermost layer. According to the present invention, surface land 38 does not have a closed shape. FIG. 1 illustrates a narrow rectangular shape which protrudes over the inner surface land 18. As described in more detail below, FIG. 4 illustrates a "T" shape for the outermost surface land, FIG. 7 illustrates an outermost surface land which is rectangular and superimposed on a border region of surface land 18, but the outermost surface land could also be "U" shaped, "L" shaped, anything but completely closed.

After both dielectric layers 14 and 28 and both metallizations are formed as described above, a hole 41 (for example, 0.030"×0.050") is formed in dielectric sheet 28 as follows. Photo lithography is used to shield the region of dielectric sheet 28 above surface land 18. Then, layer 28 is exposed to light to harden (i.e. make insoluble) the exposed ASM material. Then, the ASM material under the shield is dissolved with propylene carbonate to produce (or "develop") the hole 41 which extends adjacent to surface land 38, through layer 28 and to surface land 18. The propylene carbonate also produces a gap 51 between surface lands 38 and 18.

Next, a solder mask 53 is applied on layers 28 and 38 around the periphery of surface land 18 and solder paste (for example Alpha WS613 solder paste) comprising various size particles of 63% tin, 37% lead and a water soluble flux is applied over the hole 41 and surface land 38. Then, a lead 44 of a component 46 is positioned over the hole 41 and surface land 38. Typically, the lead will cover approximately half of hole 41 and part of the surface land 38 and is held in place by tackiness of the solder paste until the solder is reflowed. Next, the solder is reflowed (i.e. heated) and thereby flows by gravity and surface tension well into hole 41, onto surface land 18, against surface land 38, by capillary action into the gap 51 between surface lands 18 and 38 and against lead 44 as illustrated. (Alternately, a wave soldering or solder leveling technique can be used to solder and thereby electrically interconnect the component lead 44 to surface lands 18 and 38.) The final solder arrangement is illustrated as 55. This forms a complete electrical connection between both surface lands and the component lead 44. Because surface land 38 does not surround hole 41, the solder does not bridge across hole 41 and instead forms a solid connection between the two surface lands as described above. Also, because surface land 38 does not surround hole 41 and the solder does not bridge, gases can escape along the perimeter of the hole 41 away from surface land 38 without pushing up the solder.

Figure 4:
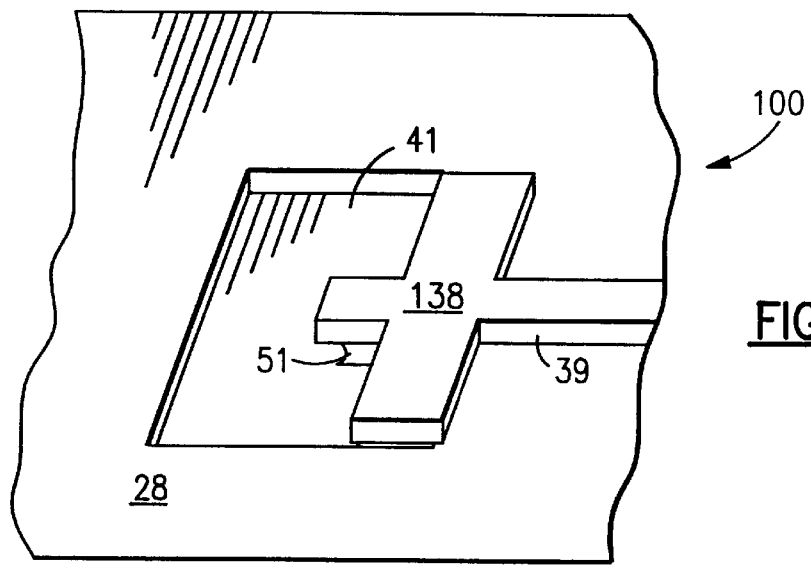
FIG. 4 is a perspective view of a portion of another electronic circuit card according to another embodiment of the present invention during formation; surface lands are provided in two circuit layers but are not yet interconnected.
Figure 5:
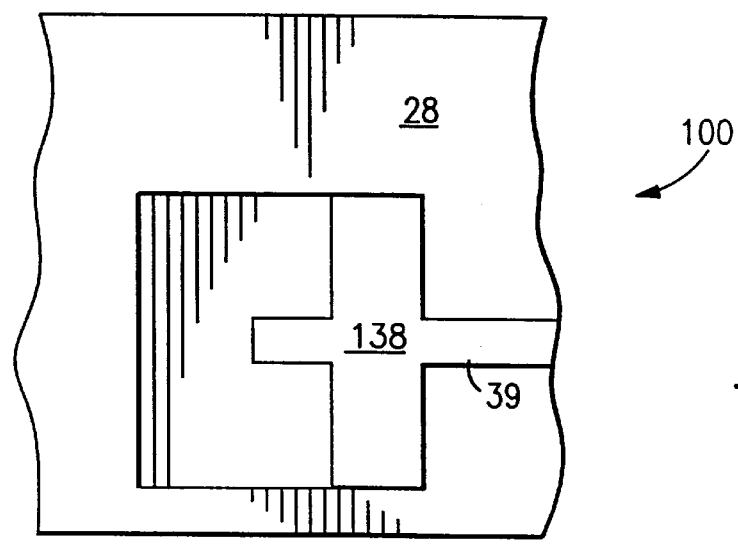
FIG. 5 is a top view of the electronic circuit card of FIG. 4.
Figure 6:
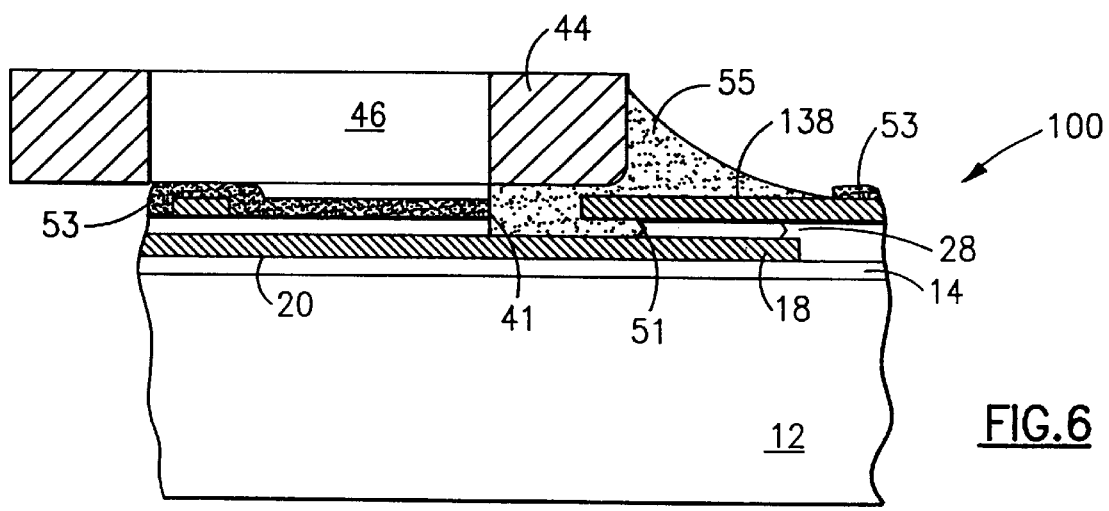
FIG. 6 is a side view of FIG. 5 after a component lead has been soldered to the surface lands.

FIGS. 4–6 illustrate a second embodiment of an electronic circuit card generally designated 100 of the present invention. Card 100 is identical to card 10 except that outermost surface land 138 of card 100 is "T"-shaped to provide additional connection area.

Figure 8:
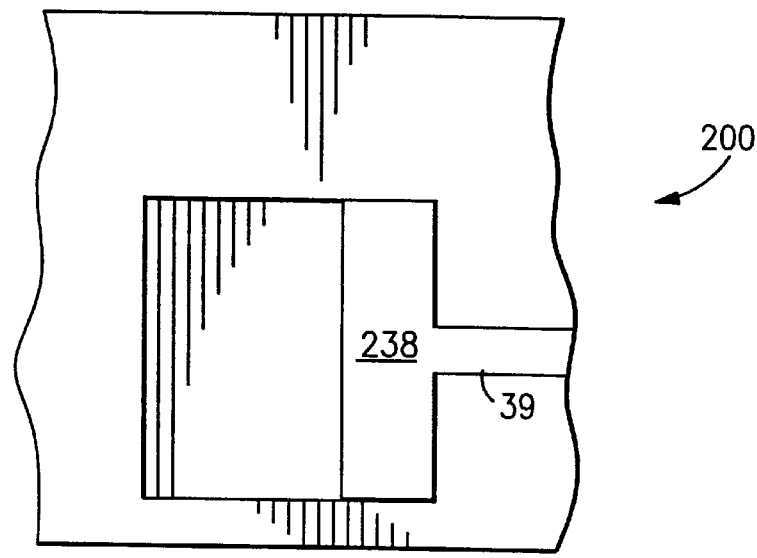
FIG. 8 is a top view of the electronic circuit card of FIG. 7.
Figure 9:
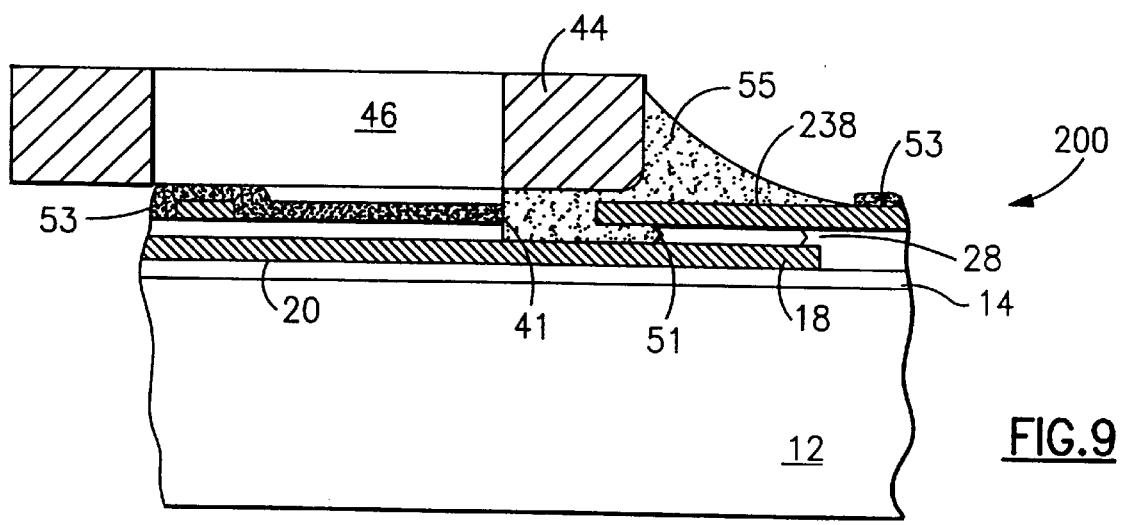
FIG. 9 is a side view of FIG. 8 after a component lead has been soldered to the surface lands.

FIGS. 7–9 illustrate a third embodiment of an electronic circuit card generally designated 200 of the present invention. Card 200 is identical to card 10 except that outermost surface land 238 of card 100 is superimposed on a border region of surface land 18.

Figure 10:
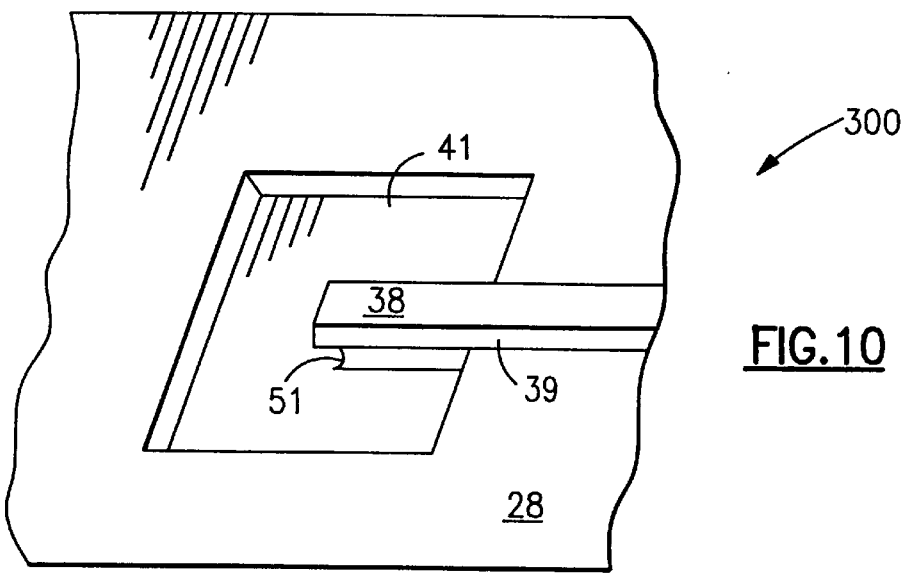
FIG. 10 is a perspective view of a portion of a fourth electronic circuit card according to the present invention during formation; a surface land is provided in one circuit layer but is not yet interconnected.
Figure 11:
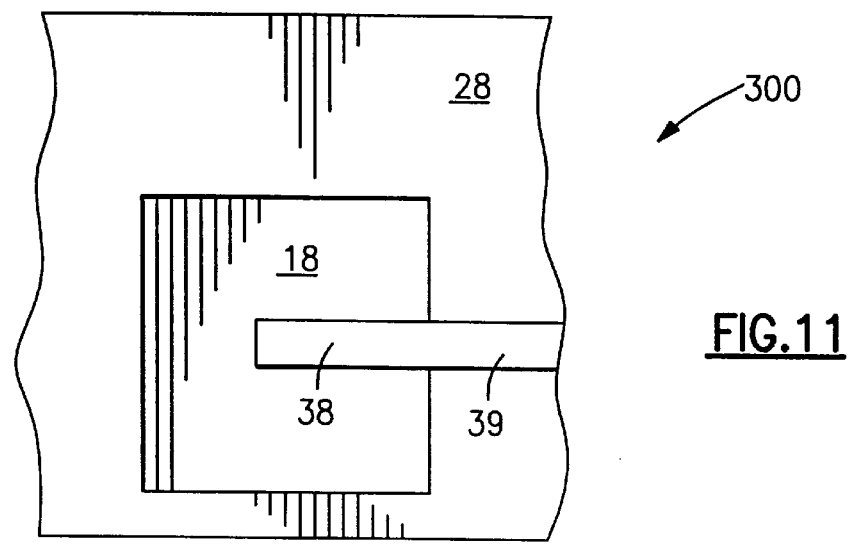
FIG. 11 is a top view of the electronic circuit card of FIG. 10.
Figure 12:
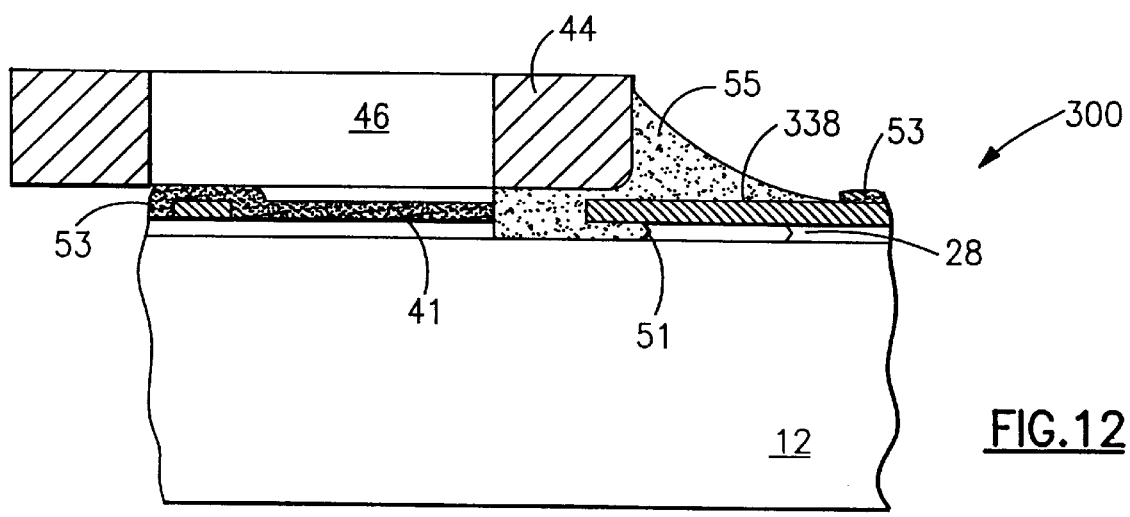
FIG. 12 is a side view of FIG. 11 after a component lead has been soldered to the surface land.

FIGS. 10–12 illustrate a fourth embodiment of an electronic circuit card generally designated 300 according to the present invention. Card 300 is identical to card 10 except that card 300 omits dielectric layer 14 and the metalization (surface land 18 and conductor 20) on layer 14. In card 300, layer 28 is laminated directly on the carrier 12. This configuration is appropriate where carrier 12 is a ground or power plane and it is desirable to connect surface land 338 and the component lead 44 directly to the ground or power plane.

Similarly, fifth and sixth embodiments of electronic circuit cards (not shown) according to the present invention can be made as in FIGS. 4–6 and 7–9, respectively, by omitting the dielectric layer 14 and the metalization (surface land 18 and conductor 20) on layer 14.

Based on the foregoing, electronic circuit cards embodying the present invention have been disclosed. However, numerous modifications and substitutions can be made without deviating from the scope of the present invention. For example, the inner surface land could have other shapes such as circular or oval. Also, the stated dimensions and materials are just examples and do not limit the scope of the present invention. Also, surface land 238 could be positioned along the periphery of surface land 18 instead of overlapping. Also, some applications require interconnection between two different layers of a PCB without mounting of a component lead. In such a case, the same PCB design as illustrated in any of the figures could be utilized, except that the component lead is omitted; the solder merely connects outer surface land 38 to inner surface land 18 in FIGS. 1–9, or connects outer surface land 38 directly to carrier 12 in FIGS. 10–12. Therefore, the present invention has been disclosed by way of illustration and not limitation, and reference should be made to the following claims to determine the scope of the present invention.

We claim:

1. An electronic circuit card for mounting a component, said card comprising:

a first surface land on an inner layer;

a dielectric material on said inner layer;

a second surface land on said dielectric material overlapping said first surface land, a hole in said dielectric material exposing said first surface land to said second surface land, said second surface land not completely surrounding said hole; and solder within said hole interconnecting said surface lands to each other.

2. An electronic circuit card as set forth in claim 1 wherein said solder fills a gap in said dielectric material between part of said second surface land and said first surface land.

3. An electronic circuit card as set forth in claim 1 wherein said first surface land is rectangular or circular and said second surface land is rectangular and protrudes over said first surface land.

4. An electronic circuit card as set forth in claim 1 wherein said first surface land is rectangular and said second surface land is "T-shaped" with one section of the "T" protruding over said first surface land and another section of the "T" bordering said first surface land.

5. An electronic circuit card as set forth in claim 1 wherein said first surface land is rectangular and said second surface land is rectangular and borders said first surface land.

6. An electronic circuit card as set forth in claim 1 further comprising a component lead positioned over said second surface land and said hole and joined by said solder.

7. An electronic circuit card as set forth in claim 1 wherein said dielectric material comprises an etchable material and said hole is formed by etching into said dielectric material.

8. An electronic circuit card as set forth in claim 1 wherein there is no plating in said hole to electrically connect said surface lands.

9. An electronic circuit card as set forth in claim 1 wherein said solder was formed by applying solder paste into said hole and onto said second surface land and then reflowing said solder.

10. An electronic circuit card as set forth in claim 1 further comprising a component lead positioned over said second surface land or said hole and joined by said solder.

11. An electronic circuit card for mounting a component, said card comprising:

a first surface land on an inner layer;

a dielectric material on said inner layer;

a second surface land on said dielectric material along a border of said first surface land, a hole in said dielectric material exposing said first surface land to said second surface land, said second surface land not completely surrounding said hole; and solder within said hole interconnecting said surface lands to each other.

12. An electronic circuit card as set forth in claim 11 wherein said solder fills a gap in said dielectric material between part of said second surface land and said first surface land.

13. An electronic circuit card as set forth in claim 11 wherein said first surface land is rectangular or circular and said second surface land is rectangular and protrudes over said first surface land.

14. An electronic circuit card as set forth in claim 11 further comprising a component lead positioned over said second surface land and said hole and joined by said solder.

15. An electronic circuit card as set forth in claim 11 wherein said dielectric material comprises an etchable material and said hole is formed by etching into said dielectric material.

16. An electronic circuit card as set forth in claim 11 wherein there is no plating in said hole to electrically connect said surface lands.

17. An electronic circuit card as set forth in claim 11 wherein said solder was formed by applying solder paste into said hole and onto said second surface land and then reflowing said solder.

18. An electronic circuit card as set forth in claim 11 further comprising a component lead positioned over said second surface land or said hole and joined by said solder.

19. A method for forming an electronic circuit card, said method comprising steps of:

forming a first surface land on an inner layer;

laminating a dielectric material on said inner layer;

forming a second surface land on said dielectric material overlapping said first surface land;

forming a hole in said dielectric material exposing said first surface land to said second surface land, said second surface land not completely surrounding said hole; and applying solder to said hole and surface lands to interconnect said surface lands to each other.

20. A method as set forth in claim 19 further comprising a step of positioning a lead of a component over said second surface land and said hole; and wherein the solder applying step connects said component lead to said surface lands.

21. A method as set forth in claim 19 wherein:

the hole forming step includes a step of forming a gap between a portion of said second surface land and said first surface land; and the solder applying step includes a step of filling said gap with solder.

22. A method as set forth in claim 19 further comprising a step of positioning a lead of a component over said second surface land or said hole; and wherein the solder applying step connects said component lead, to said surface lands.

23. A method for forming an electronic circuit card, said method comprising steps of:

forming a first surface land on an inner layer;

laminating a dielectric material on said inner layer;

forming a second surface land on said dielectric material along a border of said first surface land;

forming a hole in said dielectric material exposing said first surface land to said second surface land, said second surface land not completely surrounding said hole; and applying solder to said hole and surface lands to interconnect said surface lands to each other.

24. A method as set forth in claim 23 further comprising a step of positioning a lead of a component over said second surface land and said hole; and wherein the solder applying step connects said component lead to said surface lands.

25. A method as set forth in claim 23 wherein:

the hole forming step includes a step of forming a gap between a portion of said second surface land and said first surface land; and the solder applying step includes a step of filling said gap with solder.

26. A method as set forth in claim 23 further comprising a step of positioning a lead of a component over said second surface land or said hole; and wherein the solder applying step connects said component lead to said surface lands.

27. An electronic circuit card for mounting a component, said card comprising:

a metallic plane layer;

a dielectric material on said plane layer;

a surface land on said dielectric material overlapping said plane layer, a hole in said dielectric material exposing said surface land to said plane layer, said surface land not completely surrounding said hole; and solder within said hole interconnecting said surface land to said plane layer.

28. An electronic circuit card as set forth in claim 27 wherein said plane layer is a metal carrier layer.

29. An electronic circuit card as set forth in claim 27 further comprising a component lead positioned over said surface land and said hole and joined by said solder.

30. An electronic circuit card as set forth in claim 27 further comprising a component lead positioned over said surface land or said hole and joined by said solder.

* * * * *